(12) United States Patent
Lau

(10) Patent No.: US 10,110,229 B1
(45) Date of Patent: Oct. 23, 2018

(54) AGING-RESISTANT SIGNAL PATH CIRCUITRY

(71) Applicant: Intel Corporation, Santa Clara, CA (US)

(72) Inventor: Ker Yon Lau, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/615,704

(22) Filed: Jun. 6, 2017

(51) Int. Cl.
*H03K 19/003* (2006.01)
*G11C 7/04* (2006.01)

(52) U.S. Cl.
CPC ......... *H03K 19/00369* (2013.01); *G11C 7/04* (2013.01)

(58) Field of Classification Search
None
See application file for complete search history.

(56) References Cited

U.S. PATENT DOCUMENTS

| 9,257,977 B1* | 2/2016 | Chang ................. H03K 5/1565 |
| 2010/0231258 A1* | 9/2010 | Iwai ..................... G11C 19/285 |
| | | 326/80 |
| 2014/0266359 A1* | 9/2014 | Ma ....................... H03K 5/1565 |
| | | 327/175 |

* cited by examiner

*Primary Examiner* — Jany Richardson
(74) *Attorney, Agent, or Firm* — Fletcher Yoder, P.C.

(57) ABSTRACT

Systems and methods are related to selectively inverting circuit paths of an integrated circuit to reduce errors due to aging. An integrated circuit includes a first circuit path that receives an input signal and outputs a first output signal, a first selective inverter that receives the first output signal and outputs a first inverter output signal; and a second circuit path that receives the first selective inverter output signal and outputs a second output signal. In a first mode, the first selective inverter does not invert the first output signal and outputs the first output signal as the first selective inverter output signal. In a second mode, the first selective inverter inverts the first output signal and outputs an inverse of the first output signal as the first selective inverter output signal.

14 Claims, 6 Drawing Sheets

AGING-RESISTANT SIGNAL PATH CIRCUITRY

BACKGROUND

The present disclosure relates generally to systems and methods that counteract aging effects due to negative-bias temperature instability.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

An electronic device may transmit and receive data between various internal components as well as to other electronic devices based on rising and/or falling edges of clock signals. The circuitry of the electronic device that transmits or receives the data may depend on a relatively stable duty cycle for proper operation. For example, a signal may have a duty cycle of 50% in which the signal may be in a HIGH logic state (e.g., 1) for half of the signal period and in a LOW logic state (e.g., 0) for the other half of the signal period. Signals that are in a HIGH logic state for more than half of the signal period have a duty cycle above 50%, while signals that are in a LOW logic state for more than half of the signal period have duty cycles below 50%. It should be noted that different circuitry may specify different duty cycles; while a 50% duty cycle may be specified for certain types of circuitry, other duty cycles may be used by other types of circuitry.

Many high-speed circuits use both the rising and the falling edges of a clock signal for timing. Circuits that rely on both the rising and the falling edges of a signal include double-data-rate (DDR) circuitry, as well as half-rate clock and data recovery (CDR) circuits. These circuits could be subject to aging due to prolonged periods of time where one particular state of the signal is applied for an extended period of time. For example, longer periods of a LOW logic state that occurs when the clock signal is disabled may age the circuit to in a way that causes the duty cycle to be distorted in a particular way. When this occurs, a desired duty cycle (e.g., 50%) may become distorted to operate at higher than or lower than 50%. Aging in which the duty cycle tends towards the state of the signal after prolonged exposure to that state may be referred to as negative-bias temperature instability.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The systems and methods described herein reduce effects of negative-bias temperature instability on integrated circuits where there is a signal in one state for longer periods than the signal is in another state. One or more circuit paths may receive a signal, such as a clock signal, data signal, or the like, from the integrated circuit or another integrated circuit. The circuit paths may provide an output signal to the integrated circuit based on the received signal. The integrated circuit may read or write data from the signal in a read or write mode and may not read or write the data while in an idle mode. By controlling the signals provided to some of the circuit paths to be in a LOW state and controlling the signals provided to other circuit paths to be in a HIGH state, aging effects of the different circuit paths may counteract one another and thus be reduced in the integrated circuit overall.

In a first embodiment, an integrated circuit includes a first circuit path that receives an input signal and outputs a first output signal. The integrated circuit includes a first selective inverter that receives the first output signal and outputs a first inverter output signal. The integrated circuit includes a second circuit path that that receives the first selective inverter output signal and outputs a second output signal. In a first mode, the input signal includes a toggling signal, such as a clock signal. The first selective inverter does not invert the first output signal and outputs the first output signal as the first selective inverter output signal. In a second mode, the input signal includes a static signal, such as an idle signal. The first selective inverter inverts the first output signal and outputs an inverse of the first output signal as the first selective inverter output signal, which thereby causes the second circuit path to age in a way that produces aging effects in the second circuit path that counteract corresponding opposite aging effects in the first circuit path.

In a second embodiment, a method for operating an integrated circuit includes, in a first mode of operation of the integrated circuit, receiving a static signal into a first circuit path and using the first circuit path to produce a first output static signal from the first circuit path, thereby causing the first circuit path to age in a way that causes the first circuit path to introduce timing errors of a first polarity. In the first mode of operation, the method includes inverting the first output static signal to produce a first inverted output static signal. In the first mode of operation, the method includes receiving the first inverted output static signal into a second circuit path and using the second circuit path to produce a second output static signal from the second circuit path, thereby causing the second circuit path to age in a way that causes the second circuit path to introduce timing errors of a second polarity. In a second mode of operation of the integrated circuit, the method may include receiving a toggling signal into the first circuit path and using the first circuit path to produce a first output toggling signal from the first circuit path. The first circuit path introduces timing errors of the first polarity in the course of producing the first output toggling signal. The method includes, in the second mode of operation, receiving the first output toggling signal into the second circuit path and using the second circuit path to produce a second output toggling signal from the second circuit path. The second circuit path introduces timing errors of the second polarity in the course of producing the second output toggling signal. The timing errors of the second polarity at least partly counteract the timing errors of the first polarity.

In a third embodiment, a system includes a first circuit path that ages in a way that causes the first circuit path to introduce first signal errors. The system includes a second circuit path coupled in serial to the first circuit path. The second circuit path ages in a way that causes the second circuit path to introduce second signal errors. The second signal errors are configured to counteract the first signal errors introduced by the first circuit path.

Various refinements of the features noted above may exist in relation to various aspects of the present disclosure.

Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Numerous integrated circuits perform read and/or write operations by reading data from circuit paths according a clock signal. For example, double-data-rate (DDR) memory devices operate at a duty cycle to latch both rising and falling edges of the clock signal. To maintain proper timing in these circuits, the duty cycle of the clock signal may be maintained at 50%. Some signals may have less than 50% activity. For example, a read data strobe (RDQS) signal may be at idle more than 50% of the time. Over time, if the circuit path operates at a HIGH state for longer periods than a LOW state, the circuit path may age in a manner that causes timing errors towards the HIGH state. Similarly, if the circuit path operates at a LOW state for longer periods than a HIGH state, the circuit path may age in a manner that causes timing errors towards the LOW state. In some embodiments, dummy toggling across the RDQS circuit path may be added to toggle the RDQS signal between HIGH and LOW. However, using dummy toggling may use a significant amount of power over time. The systems and methods described below may be used to counteract the effects of aging while conserving power as compared to dummy toggling. While memory is used as an example below, any suitable integrated circuit that undergoes more aging effects in a first mode and undergoes less aging effects in a second mode may use the systems and methods described.

Figure 1:
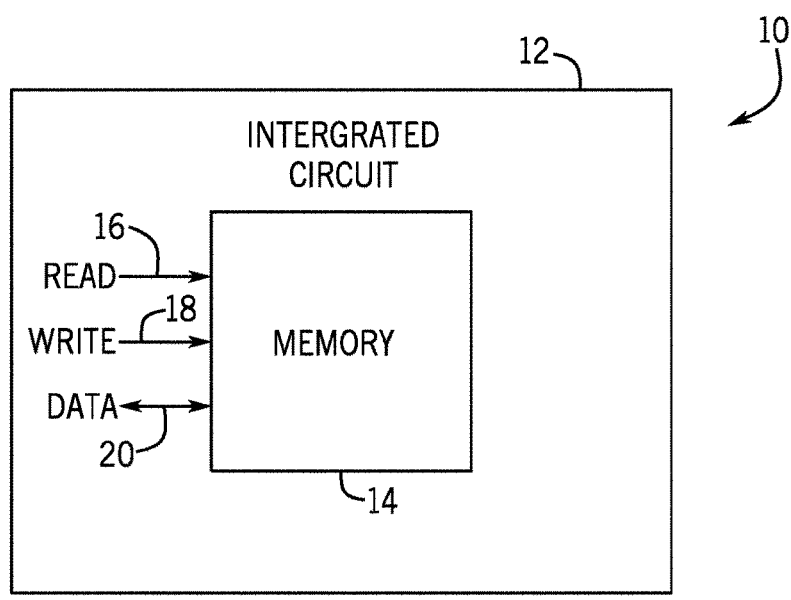
FIG. 1 is a block diagram of an integrated circuit, in accordance with an embodiment.

The inversion circuitry and methods of this disclosure may be used in any suitable integrated circuit device, such as a processor, memory, application specific integrated circuit (ASIC), and/or programmable logic device (PLD), such as a field programmable gate array (FPGA). One example appears in FIG. 1, in which a system 10 includes integrated circuit 12 that may communicate with another integrated circuit device. The integrated circuit 12 may include memory 14, such as double-data-rate (DDR) memory, high-bandwidth memory (HBM), or the like. While DDR memory is used as an example here, note that any suitable memory or circuit that operates using toggling signals may be used. The memory 14 may receive one or more read signals 16, write signals 18, or data signals 20. The read signals 16 may indicate whether there is data on the data signals to be read.

The data signals may provide data to be stored in the memory 14 or the data signals 20 may provide data to be transmitted from the memory 14. For example, the integrated circuit 12 may receive a read signal in which the integrated circuit performs a read operation to read memory from the data signal 20 into the memory 14. As a further example, the integrated circuit 12 may transmit a write signal 18 in which the integrated circuit 12 performs a write/transmit operation of data from the memory 14 to another integrated circuit via the data signal 20. The data signal 20 may be any suitable signal, such as a clock signal (e.g., RDQS signal DQS signal, etc.).

Figure 2:
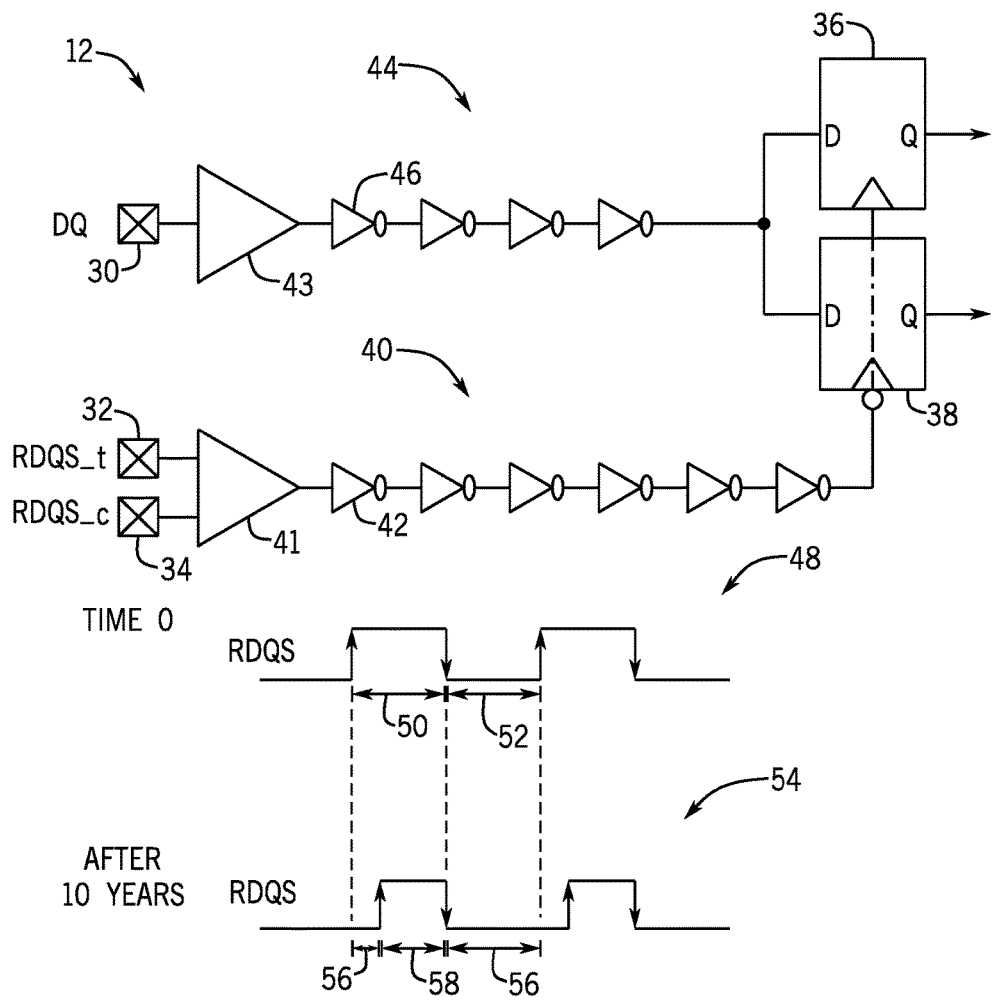
FIG. 2 is a schematic diagram of circuitry of memory of the integrated circuit of FIG. 1 performing a read operation, in accordance with an embodiment.

FIG. 2 is a diagram of an example of the integrated circuit 12 performing a read operation. The integrated circuit 12 may receive data from data signals 30, 32, and 34 to store the data into the memory 36 and 38 or to perform other operations. For example, the integrated circuit 12 includes a read data strobe (RDQS) circuit path 40 to perform various operations (e.g., read, write, etc.) from a true RDQS_t 32 signal and a complementary RDQS_c 34 signal. Further, the integrated circuit 12 may include a data output (DQ) circuit path 44 that includes circuitry to perform read operations of data from the data output signal 30. In the illustrated embodiment, the RDQS circuit path 40 and/or DQ circuit path 44 may each include input circuitry 41 and 43 as well as one or more inverters 42 and 46 or delays.

The RDQS circuit path 40 may receive data signals 32 and 34 to cause the RDQS circuit path 40 to operate in a LOW state for longer periods of time than periods of time in which the RDQS circuit path 40 operates in a HIGH state. For example, during an idle mode and/or write mode in which the memory 38 does not read data on the RDQS circuit path 40, the RDQS circuit path 40 may operate at the LOW state for longer periods than periods in which data is read. Over time, operating in LOW states for extended periods may cause the RDQS circuit path 40 to age in a way that produces timing errors in which the signal remains in a LOW state longer than desired, thereby causing duty cycle distortion.

Graph 48 is an example of a duty cycle of the RDQS signal 32 with respect to time. The duty cycle is approximately (e.g., within 1-3% of) 50%. For example, the RDQS signal 32 may initially be in a HIGH state for a period 50 of time approximately the same as the period 52 of time in which the RDQS is in a LOW state.

Periods of idle or write with less or no read activity may cause the RDQS signal 32 to be in the LOW state more often than the RDQS signal 32 is in the HIGH state. Graph 54 is an example of a duty cycle of the RDQS signal 32 that does not include circuitry to account for aging effects after a period of time (e.g., 1 year, 2 years, 5 years, or 10 years). The longer periods of the RDQS signal 32 being in the LOW state cause duty cycle distortion such that the duty cycle is less (e.g., 0.5%, 1%, 2%, 3% or more duty cycle distortion) than 50%. For example, the RDQS signal 32 may be in a HIGH state for a period 58 of time less than the time period 56 in which the RDQS is in a low state throughout a cycle.

Figure 3:
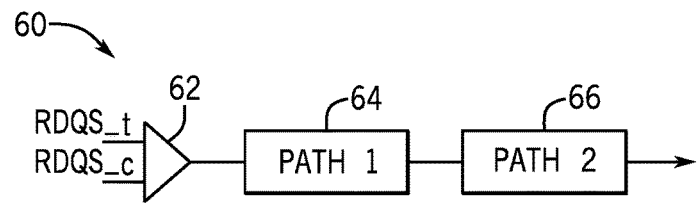
FIG. 3 is block diagram of a circuit path of the integrated circuit of FIG. 1, in accordance with an embodiment.

FIG. 3 shows an example of a circuit path 60 of the integrated circuit 12 that receives receives the RDQS_t and the RDQS_c signals via the input circuitry 62. The circuit path 60 may be divided into a first circuit path 64 and a second circuit path 66. Each of the circuit paths 64 and 66 may include one or more circuit components, such as inverters, delays, or the like. In some embodiments, the first circuit path 64 and/or the second circuit path 66 may include dummy togglings that invert the signal 32 (e.g., from a LOW state to a HIGH state, or from a HIGH state to a LOW state). However, dummy togglings drain additional power by increasing/decreasing the state of the signal 32. The longer the length of the circuit path 60, the more power dummy togglings may use. As such, other systems and methods that reduce duty cycle distortion due to aging may be desirable.

Figure 4:
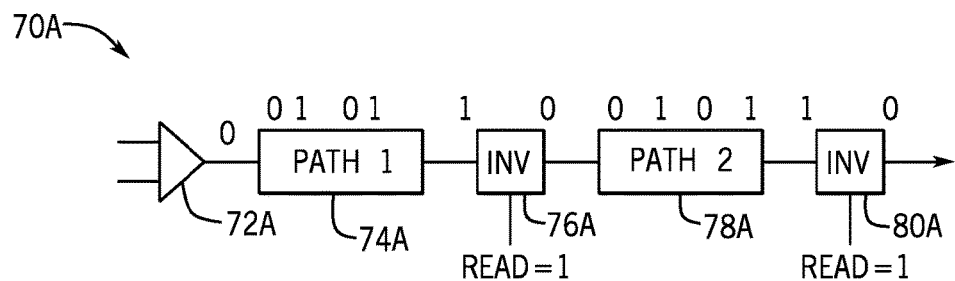
FIG. 4 is a block diagram of another circuit path of the integrated circuit of FIG. 1 having selective inverters, in accordance with an embodiment.

FIG. 4 shows an example of a circuit path 70A that reduces the effects of negative-bias temperature instability (NBTI) aging without the power losses caused by dummy togglings. The circuit path 70A includes a first circuit path 74A that includes one or more circuit components, such as inverters or delays. For example, the first circuit path 74A may include a first number of active circuit elements (e.g., three inverters), as noted by the HIGH (e.g., 1) and LOW (e.g., 0) signals through the first circuit path 74A, although any suitable circuit components may be used. The first circuit path 74A provides a first output signal to a first selective inverter 76A. The first selective inverter 76A may receive a signal (e.g., read enable) instructing the first selective inverter 76A to operate in a first mode or a second mode. The first selective inverter 76A receives the first output signal and outputs a first inverter output signal based on whether the first selective inverter 76A is in a first mode (e.g., a read mode) or a second mode (e.g., an idle mode). For example, during a first mode, the circuit path 74A may receive a toggling signal (e.g., a signal instructing the selective inverter to toggle the received signal from 0 to 1 or from 1 to 0). The first selective inverter 76A may receive a read signal instructing the first selective inverter 76A to invert the first output signal.

In some embodiments, the first mode may include a data transfer mode and the signal may include a first clock signal. The data transfer mode may include a double-data rate mode (e.g., on a rising edge and falling edge of the clock) and the first clock signal comprises a clock signal with a duty cycle of approximately 50%. As described below, the selective inverters 76A and 80A of the circuit path 70A may be used to control a polarity of timing errors through the second circuit path 78A to counteract a polarity of timing errors through the first circuit path 74A. Further, the toggling signal may include a clock signal with a duty cycle of approximately 50% where the timing errors of the second polarity counteract the timing errors of the first polarity such that the duty cycle is within 3% of the 50%. For example, the timing errors of the second polarity may counteract the timing errors of the first polarity such that after 10 years of aging, the duty cycle varies no more than 1% of a non-aged integrated circuit. The aging effects described below may refer to longer periods of time in a LOW state or in a HIGH state than approximately equal periods of time in the LOW state as the HIGH state.

For example, if the first selective inverter 76A receives the first output signal in a LOW state, then the first selective inverter 76A may provide the second circuit path 78A with a first selective inverter output signal in a HIGH state. Similarly, if the first selective inverter 76 receives the first output signal in a HIGH state, then the first selective inverter 76 may provide the second circuit path 78A with a first selective inverter output signal in a LOW state.

The second circuit path 78A may include a second number of active circuit elements (e.g., three inverters) and may receive the inverter output signal and provide the second selective inverter 80A with a second output signal. In the first mode, the second selective inverter 80A, similar to the first selective inverter 76A, may receive the second output signal from the second circuit path 78A and output an inverse of the second output signal as the second selective inverter output signal, thereby outputting a reverted signal that corresponds to the desired output. That is, if a signal having a LOW state is input into the circuit path 70A, the output from the circuit path 70B due to inversion by the first selective inverter and inversion by the second selective inverter is the second selective inverter output signal having a LOW state.

Figure 5:
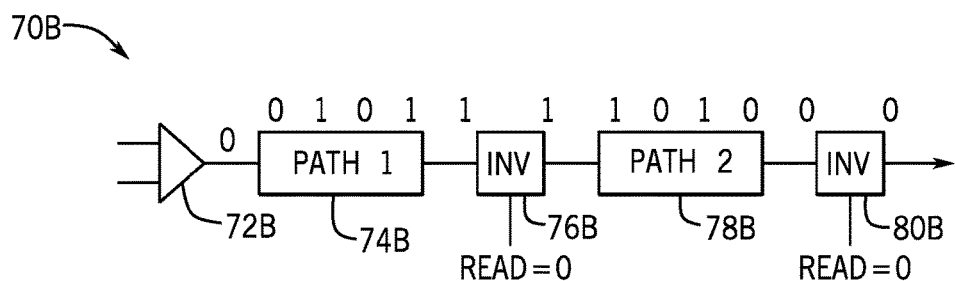
FIG. 5 is a block diagram of another circuit path of the integrated circuit of FIG. 1 having selective inverters, in accordance with an embodiment.

FIG. 5 shows another example of a circuit path 70B operating in a second mode (e.g., idle mode). In the second mode, the first data path 74B may output a first output signal. The first selective inverter 76B may receive an idle signal (e.g., READ=0 signal) and operate in a mode based on the signal. In the second mode, the first selective inverter 76B may receive the first output signal and output the first output signal as the first selective inverter output signal. That is, the first selective inverter 76B may not invert the first output signal in the second mode. For example, if the first selective inverter 76B receives the first output signal in a LOW state, then the first selective inverter 76B may provide the second circuit path 78B with a first selective inverter output signal in a LOW state. Similarly, if the first selective inverter 76B receives the first output signal in a HIGH state, then the first selective inverter 76B may provide the second circuit path 78B with a first selective inverter output in a HIGH state. The second circuit path 78B may receive the inverter output signal and provide the second selective inverter 80B with a second output signal. Because the first selective inverter 76B provided the second circuit path 76B with the first output signal instead of an inverted signal, the second circuit path 76B may have an inverted signal from the desired output. As such, in the second mode, the second selective inverter 80B, similar to the first selective inverter 74A, may receive the second output signal from the second circuit path 76B and output the second output signal as the second selective inverter output signal, thereby outputting a reverted signal that corresponds to the desired output. That is, if a signal having a LOW state is input into the circuit path 70B, the output from the circuit path 70B due to inversion by the first selective inverter and inversion by the second selective inverter is the second selective inverter output signal having a LOW state.

By selectively not inverting the signal during periods of the second mode (e.g., idle mode), the first selective inverter 76B may cause the polarity of the second circuit path 78B to be opposite the first circuit path 74B. Because the first circuit path 74 ages in a way to produce aging effects in a first direction and the second circuit path 78B ages in a way to produce aging effects in a second direction, opposite the first direction, the aging effects of the second circuit path 78B counteract the aging effects in the first circuit path 74B. Further, as shown by FIGS. 4 and 5, the output of the circuit paths 70A and 70B is the same. That is, the input to circuit path 70A is in a LOW state and the output of circuit path 70A is in a LOW state, and the input to circuit path 70B is in a LOW state and the output of circuit path 70B is in a LOW state. By selectively not inverting the signal received by the first selective inverter 76B during idle mode, the aging effects of the second circuit path 78B counteract the aging effects of the first circuit path 76B.

While this example is directed to the inverter being expected to invert the signal during read operations, in some embodiments, the expected behavior of the inverter may be to not invert the output signal during read operations. For example, the first selective inverter 76B may selectively invert the signal in embodiments that would cause the second circuit path 78B to be parked in opposite polarity from the first circuit path 74B during the second mode. Further, the second selective inverter 80B may selectively invert the signal to output a reverted signal that corresponds to the desired output. While each of the circuit paths described in these examples include two selective inverters, any suitable number of selective inverters (e.g., 2, 4, 6 or more) may be used.

Figure 6:
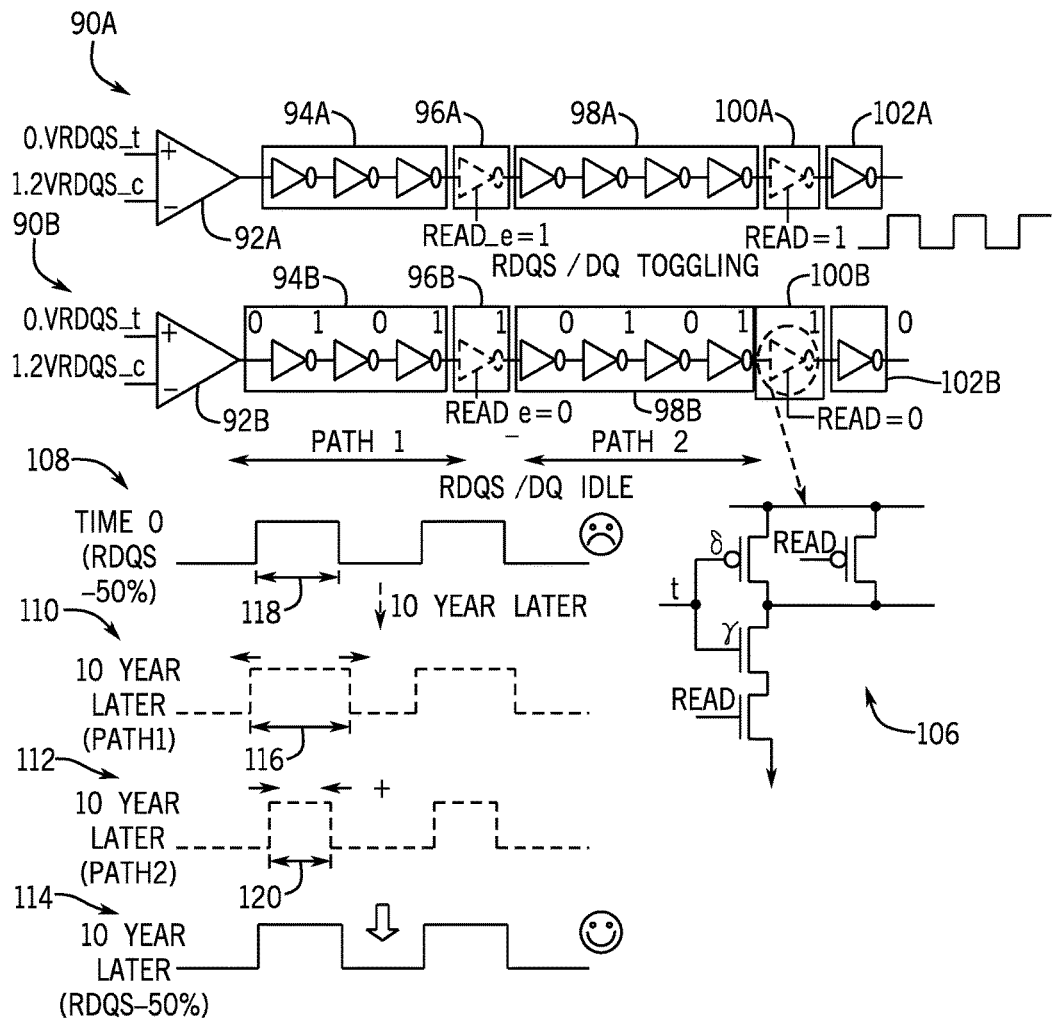
FIG. 6 is a schematic diagram of another circuit path of the integrated circuit of FIG. 1 having selective inverters, in accordance with an embodiment.

FIG. 6 is an example of another circuit path 90A and 90B in a first mode and in a second mode, respectively. The circuit path 90A and 90B may include input circuitry 92A and 92B that receives a clock signal. The circuit paths 90A and 90B are partitioned to include a first circuit path 94A and 94B, a second circuit path 98A and 98B, and a third circuit path 102A and 102B. As shown in the illustrated embodiment, each of the first circuit path 94A and 94B, the second circuit path 98A and 98B, and the third circuit paths 102A and 102B may be different or the same lengths as each other. For example, the first circuit path 94A and 94B may include three inverters, while the second circuit path 98A and 98B may include 4 inverters. A first selective inverter 96A and 96B may be included between the first circuit path 94A and 94B. A second selective inverter 100A and 100B may be included between the second circuit path 98A and 98B and the third circuit path 102A and 102B.

In the illustrated embodiment, the input circuitry 92A may receive a clock signal. For example, if the input signal is a clock signal or a strobe signal, it may be desirable to maintain a duty cycle of approximately 50%. While in an active mode (e.g., read mode), the clock signal of the circuit path 90A may move from the HIGH state to the LOW state, and back to a HIGH state, reducing effects of negative-bias temperature instability over time. While in an idle mode, the output of the circuit path 90B may be in a LOW state, or in some embodiments a HIGH state, for extended periods of time. As explained above, a first selective inverter 96B may invert the polarity of the first output signal of the first circuit path 94B from a HIGH state to a LOW state. As such, the second circuit path 98B may age in a way that produces aging effects in the second circuit path 98B towards the LOW state to counteract aging effects in the first circuit path 94B which produces aging effects towards the HIGH state.

The selective inverters 96A, 100A, 96B, and 100B may include a NAND gate 106 to toggle the output according to the mode of operation. For example, The NAND gate 106 may control the output such that when in idle mode (e.g., READ=LOW state), the output of the NAND gate 106 is opposite of the input. When in active mode (e.g., READ=HIGH state), the output of the NAND gate 106 corresponds to the input without inversion.

FIG. 6 further includes a set of graphs 108, 110, 112, and 114 of the clock signal output with respect to time. The clock signal of graph 108 may be an initial clock signal having a duty cycle of approximately 50% in which the clock signal is in a HIGH state for an equal amount of time as the clock signal is in a LOW state. Graph 110 shows the clock signal output by the first circuit path 94A in an active mode. Over time, the first circuit path 94B may produce signal errors having a dilation in which the period 116 of time that the clock signal is in a HIGH state is extended (e.g., as compared to the initial period 118) due to aging of the first circuit path 94B from having longer periods of signals in a HIGH state. Further, over time, the second circuit path 98B may produce signal errors have a contraction in which the period 120 of time that the clock signal is in a HIGH state is reduced (e.g., as compared to the initial period 118).

Graph 114 may be the output of the circuit path 90A and 90B in which the contraction of the HIGH state in the second circuit path 98B offsets the dilation of the HIGH state in the first circuit path 94B such that the output of the circuit path 90B has approximately 50% duty cycle. That is, by the selective inverters 96B and 100B causing the first circuit path 94B to be in primarily a HIGH state during idle and the second circuit path to be primarily in a LOW state during idle without affecting the output of the circuit path 90B, the contraction of the second circuit path 98B counteracts the dilation of the first circuit path 94B to maintain approximately a 50% duty cycle. As compared to graph 84 of FIG. 2 which does not include the selective inverters 96A, 96B, 100A, and 100B, the effects of negative-bias temperature instability may be minimized on the duty cycle without the use of dummy toggling. For example, over a period of 10 years, distortion of the duty cycle from negative-bias temperature instability may be limited to in the embodiment shown in FIG. 6 to less than approximately 0.5%, 1%, or 2% from a 50% duty cycle, whereas negative-bias temperature instability may distort the duty cycle in FIG. 2 to be greater than 1%, 2%, 3%, or more.

Figure 7:
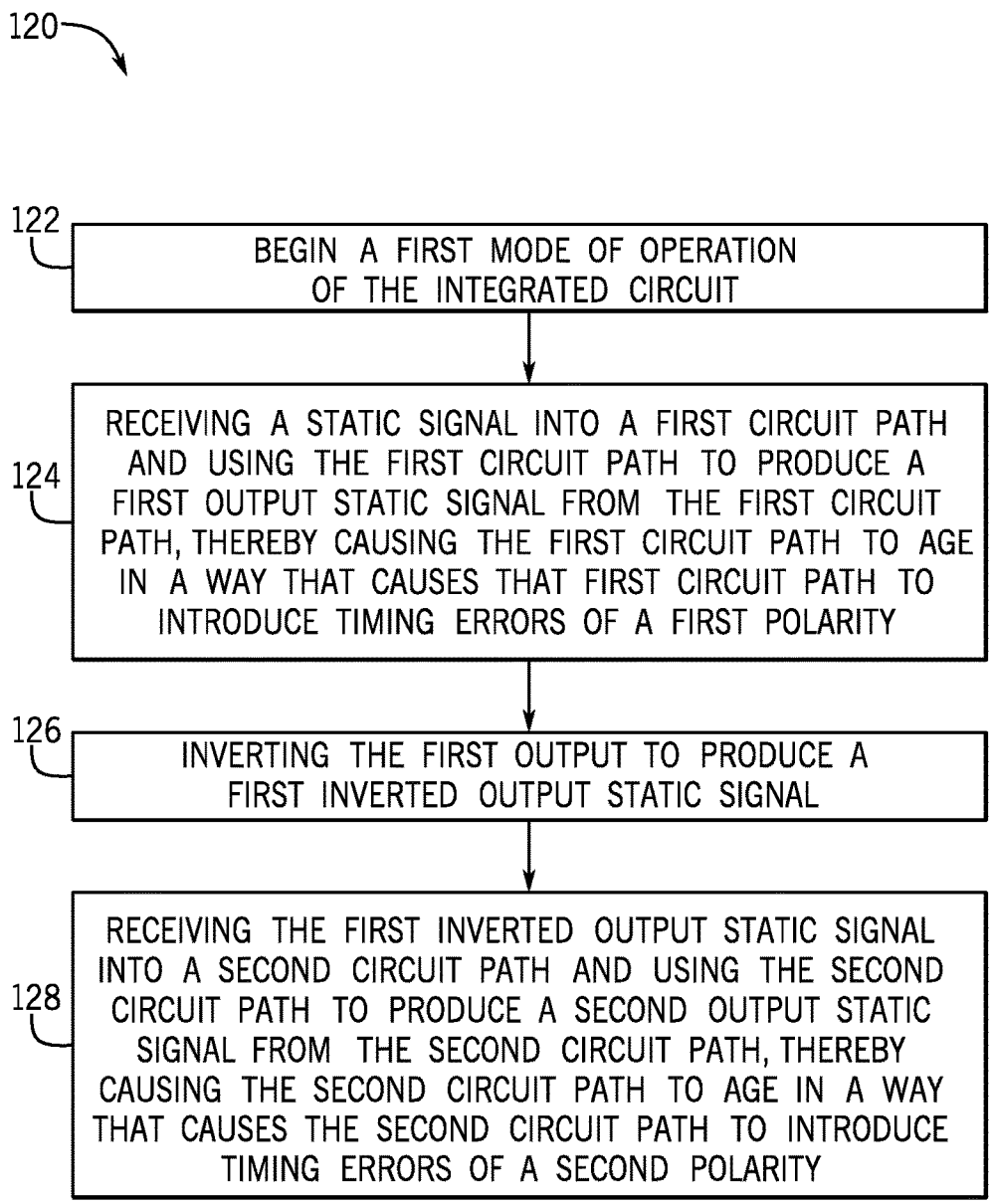
FIG. 7 is a method to be performed by the integrated circuit of FIG. 1, in accordance with an embodiment.
Figure 8:
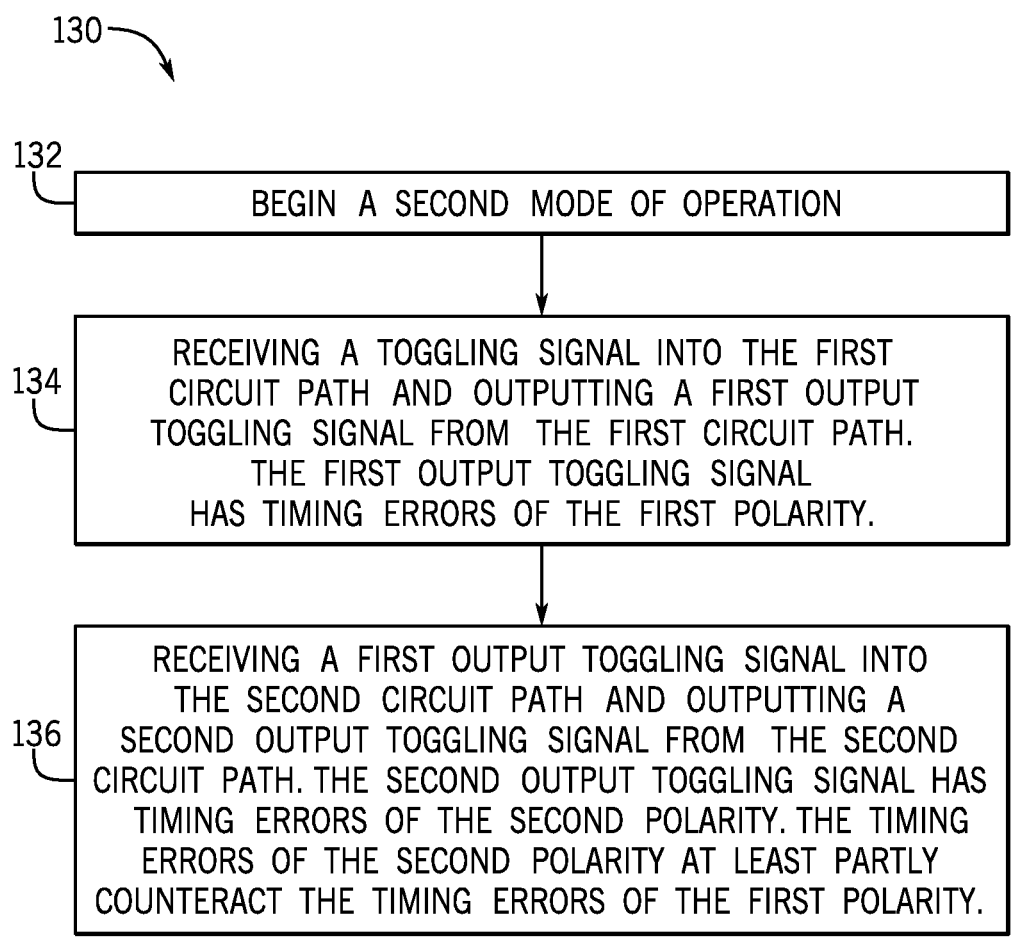
FIG. 8 is another method to be performed by the integrated circuit of FIG. 1, in accordance with an embodiment.

FIGS. 7 and 8 show processes 120 and 130 that may be performed by the integrated circuit to counteract timing errors introduced by aging of the circuit path 90B. Although it is described with respect to the circuit path 90B, any suitable circuit path may be used to perform the process 120. The process 120 may begin in a first mode (e.g., idle mode) of operation of the integrated circuit (block 122). The process 120 may include receiving a static (e.g., consecutive LOW state or consecutive HIGH state) signal (e.g., an idle signal) into a first circuit path 94B and using the first circuit path 94B to produce a first output static (e.g., consecutive LOW state or consecutive HIGH state) signal from the first circuit path 94B, thereby causing the first circuit path 94B to age in a way that causes the first circuit path 94B to introduce timing errors of a first polarity (block 124). In the example described above, the timing errors may be introduced due to extended time periods of the LOW signal. The process 120 may continue by inverting the first output static signal to produce a first inverted output static signal (block 126). The process 120 may include receiving the first inverted output static signal into a second circuit path and using the second circuit path to produce a second output static signal from the second circuit path, thereby causing the second circuit path to age in a way that causes the second circuit path to introduce timing errors of a second polarity (block 128).

FIG. 8 shows another process 130 that may be performed by the integrated circuit 12 in a second mode of operation (block 132). The process 130 may continue by receiving a toggling signal into the first circuit path and outputting a first output toggling signal from the first circuit path (block 134). The first output toggling signal has timing errors of the first polarity. The process may continue by receiving the first output toggling signal into the second circuit path and outputting a second output toggling signal from the second circuit path (block 136). The second output toggling signal has timing errors of the second polarity where the timing errors of the second polarity at least partly counteract the timing errors of the first polarity.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A system comprising:
    a first circuit path, wherein the first circuit path is configured to age in a way that causes the first circuit path to introduce first signal errors; and
    a second circuit path coupled in serial to the first circuit path, wherein the second circuit path is configured to age in a way that causes the second circuit path to introduce second signal errors, wherein the second signal errors are configured to counteract the first signal errors introduced by the first circuit path wherein, when the first circuit path and the second circuit path process a toggling signal configured to toggle between a first state of the toggling signal and a second state of the toggling signal:
        the first signal errors comprise a dilation of the first state of the toggling signal and a contraction of the second state of the toggling signal; and
        the second signal errors comprise a dilation of the second state of the toggling signal and a contraction of the first state of the toggling signal.

2. The system of claim 1, wherein the first circuit path and the second circuit path process the toggling signal in a first mode of operation, wherein the first mode of operation comprises a data transfer mode and the toggling signal comprises a clock signal.

3. The system of claim 2, wherein the data transfer mode comprises a double-data rate mode.

4. The system of claim 2, wherein the first circuit path and the second circuit path process a static signal in a second mode of operation, wherein the second mode of operation comprises an idle mode.

5. The system of claim 4, wherein the static signal comprises a logical LOW state to conserve power.

6. The system of claim 1, wherein the first circuit path has a first number of active circuit elements that process a signal input to the first circuit path and the second circuit path has a second number of active circuit elements that process an additional signal output from the first circuit path, wherein the first number of active circuit elements is the same as the second number of active circuit elements.

7. The system of claim 1, wherein the first circuit path and the second circuit path comprise active circuit elements, wherein the active circuit elements comprise inverters.

8. The system of claim 1, wherein the toggling signal comprises a clock signal with a duty cycle of approximately 50%, and wherein the second signal errors are configured to counteract the first signal errors such that the duty cycle is within 3% of the 50%.

9. The system of claim 1, wherein the second signal errors are configured to counteract the first signal errors such that after 10 years of aging, a duty cycle of the toggling signal varies no more than 1% from a non-aged integrated circuit.

10. The system of claim 1, wherein the first signal errors comprise timing errors of a first polarity and the second signal errors comprise timing errors of a second polarity opposite the first polarity.

11. The system of claim 1, wherein the dilation of the first state of the toggling signal is offset by the contraction of the first state of the toggling signal, and wherein the contraction of the second state of the toggling signal is offset by the dilation of the second state of the toggling signal.

12. The system of claim 1, comprising an inverter configured to selectively invert signals passing from out of the first circuit path and into the second circuit path, wherein the inverter is configured to:
    invert the signals when the first circuit path and the second circuit path are operating in the idle mode and wherein the inverter is configured not to invert the signals when the first circuit path and the second circuit path are not operating in the idle mode; or
    invert the signals when the first circuit path and the second circuit path are not operating in the idle mode and wherein the inverter is configured to invert the signals when the first circuit path and the second circuit path are not operating in the idle mode.

13. The system of claim 12, comprising a second inverter configured to selectively invert additional signals passing from out of the second circuit path, wherein the second inverter is configured to invert the additional signals to offset the inverting of the signals.

14. The system of claim 1, wherein, when the first circuit path and the second circuit path process a static signal:
    the first signal errors comprise a dilation of a first state of the static signal and a contraction of a second state of the static signal; and
    the second signal errors comprise a dilation of the second state of the static signal and a contraction of the first state of the static signal.

* * * * *